United States Patent [19]

Graefe et al.

[11] Patent Number: 5,376,896

[45] Date of Patent: Dec. 27, 1994

[54] APPARATUS AND METHOD FOR REDUCING VCA DISTORTION AND NOISE

[75] Inventors: Thomas M. Graefe, Ft. Lauderdale; Kenneth Beverly, Margate, both of Fla.

[73] Assignee: Sony Electronics Inc., Park Ridge, N.J.

[21] Appl. No.: 988,976

[22] Filed: Dec. 10, 1992

[51] Int. Cl.$^5$ .......................... H03F 1/32; H03F 3/68
[52] U.S. Cl. ..................... 330/149; 330/295
[58] Field of Search ................... 330/124, 149, 295

[56] References Cited

U.S. PATENT DOCUMENTS 3,477,031 11/1969 Nagata ..................... 330/295 X
4,628,278 12/1986 Bottman ..................... 330/149

OTHER PUBLICATIONS

Chapman, "Noise Cancelling Preamp," *Elektor* Jul.-/Aug. 1977, No. 7-8, vol. 3 p. 58.

*Primary Examiner*—James B. Mullins
*Attorney, Agent, or Firm*—Ronald P. Kananen

[57] ABSTRACT

To reduce the level of noise and to reduce distortion, an input audio signal is equally divided between a pair of VCAs. Each VCA receives an equal portion of the audio signal's current and has its gain controlled by a common control voltage. The outputs of the VCAs are summed together and are applied to an inverting input terminal of an op-amp. The gain of the VCAs is set at 6 dB and the gain of the op-amp is set at −6 dB. Since the op-amp sums audio signals at 6 dB and sums noise and broadband signals at 3 dB, the signal to noise ratio in the output signal is increased and the noise level, the total harmonic distortion, the intermodulation distortion, and the DC feed through are all reduced in comparison to the input signal.

12 Claims, 3 Drawing Sheets

APPARATUS AND METHOD FOR REDUCING VCA DISTORTION AND NOISE

BACKGROUND OF THE INVENTION

1. Field of the Invention

The invention generally relates to an apparatus and method for reducing noise and, more particularly, for reducing noise and distortion in a voltage controlled amplifier.

2. Description of Prior Art

A voltage controlled amplifier ("VCA") amplifies an input signal according to the level of a control signal. The VCA is often used in audio consoles in order to control the gain of an input audio signal. By having the audio signals pass through separate VCAs, the levels of the various audio signals, and therefore the mix of the signals, may be selectively controlled by varying the control voltages applied to the respective VCAs. Also, the control voltage may be varied in order to fade the audio signal either in or out.

For example, with reference to FIG. 1, a VCA IC1 receives an input audio signal at its IN+ and IN− input pins. A control voltage is supplied to the VCA IC1 at its VC pin. The VCA IC1 then produces an amplified input audio signal, which is generated at its output pin VG, according to the magnitude of the control voltage. When the control voltage is at 0 volts, the input audio signal would have full attenuation. At a control voltage of 4.44 volts, the input audio signal would have unity gain and at a control voltage of 5 volts, the VCA IC1 operates at +12 dB gain.

The output of the VCA IC1 is applied to a non-inverting input of an op-amp IC2. The op-amp IC2 has a parallel combination of a resistor R4 and a capacitor C14 connected between an output of the op-amp IC2 and an inverting input of the op-amp IC2. The output signal generated at the output of op-amp IC2 is supplied to an output terminal T2. The VCA IC1, however, is prone to DC feed through, has a relatively very high distortion level, and has a very high noise level. For instance, with the prior art configuration of FIG. 1 where the gain of VCA IC1 is set to 0 dB and the gain of op-amp IC2 is set to 0 dB, the VCA IC1 has a noise level of 92.5 dB. The total harmonic distortion ("THD") as a percentage of unity gain for 0 dB, 20 dB, and 21 dB are 0.0041%, 0.0154%, and 0.221%, respectively. The intermodulation distortion ("IM") at 0 dB, 12 dB, 20 dB, and 21 dB are 0.0125%, 0.0242%, 0.0481%, and 0.280%, respectively.

SUMMARY OF THE INVENTION

It is an object of the present invention to provide an apparatus and method which overcomes these as well as other problems in the prior art.

It is also an object of the present invention to provide an apparatus and method which reduces the noise level in an audio signal.

It is another object of the present invention to provide an apparatus and method which reduces the intermodulation distortion in an audio signal.

It is yet another object of the present invention to provide an apparatus and method which reduces the total harmonic distortion in an audio signal.

It is a further object of the present invention to provide an apparatus and method which reduces DC feed through in an audio signal.

It is yet a further object of the present invention to provide an apparatus and method which reduces noise, distortion, and DC feed through in audio consoles.

Additional objects, advantages and novel features of the invention will be set forth in the description which follows, and will become apparent to those skilled in the art upon reading this description or practicing the invention. The objects and advantages of the invention may be realized and attained by the appended claims.

To achieve the foregoing and other objects, in accordance with the present invention, as embodied and broadly described herein, an apparatus for reducing noise and distortion comprises a plurality of VCAs with each one receiving a portion of an input audio signal. The VCAs have their gains commonly controlled with a control voltage and have their outputs summed together at an input of an amplifier, which has a gain equal to the inverse of the gain for the VCAs. While summing the outputs of the VCAs, the audio signals are summed at a ratio of 6 dB while noise is only summed at a ratio of 3 dB. Thus, the signal to noise ratio is increased and the noise level, the total harmonic distortion, the intermodulation distortion, and the DC feed through are all reduced.

BRIEF DESCRIPTION OF THE DRAWINGS

The accompanying drawings, which are incorporated in, and form a part of, the specification, illustrate an embodiment of the present invention and, together with the description, serve to explain the principles of the invention. In the drawings.

DETAILED DESCRIPTION OF THE PREFERRED EMBODIMENT

Reference will now be made in detail to the preferred embodiment of the invention, an example of which is illustrated in the accompanying drawings.

Figure 2A:
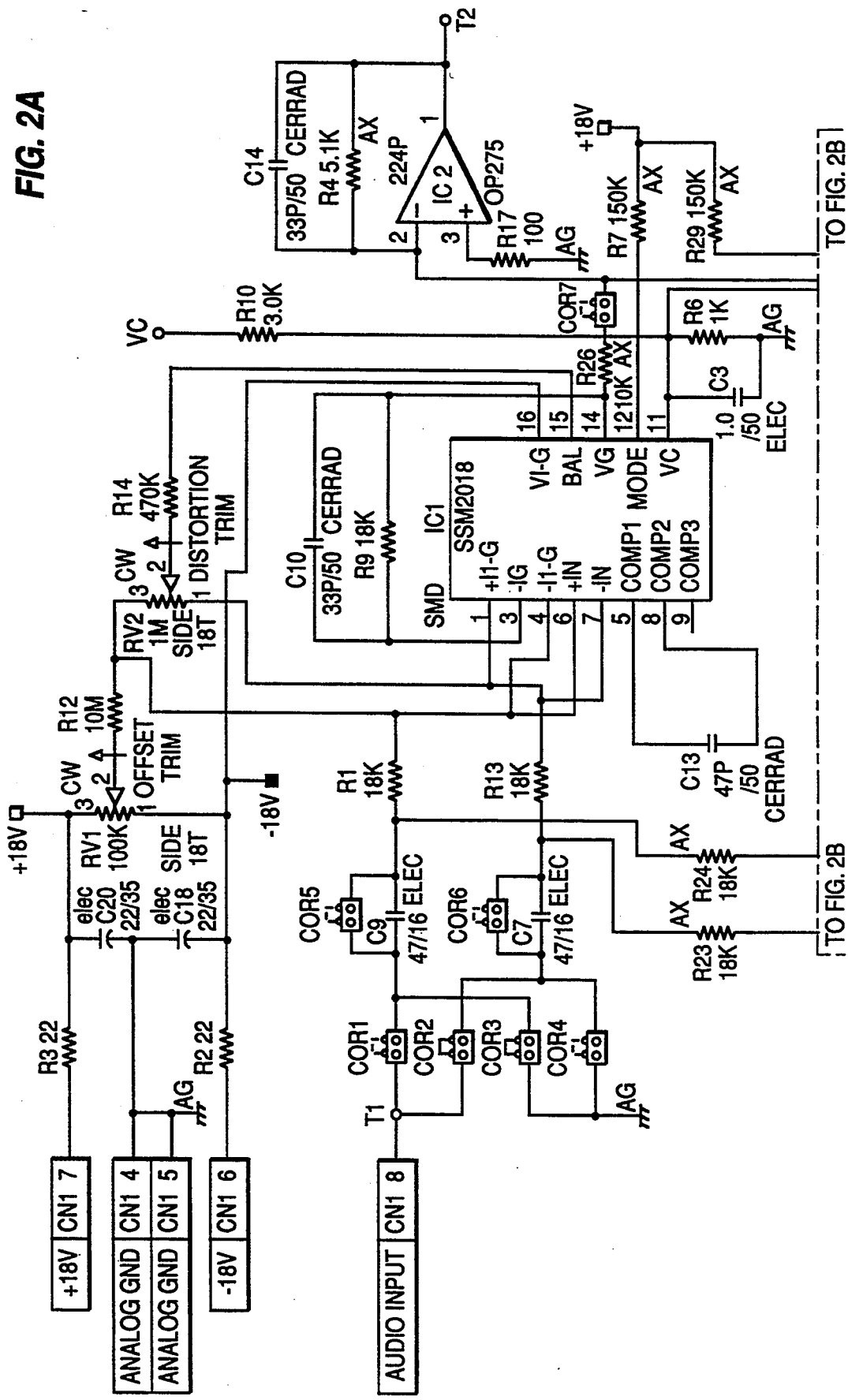
FIGS. 2A and 2B are schematics of an embodiment of the invention having dual VCAs in a current sharing arrangement.
Figure 2B:
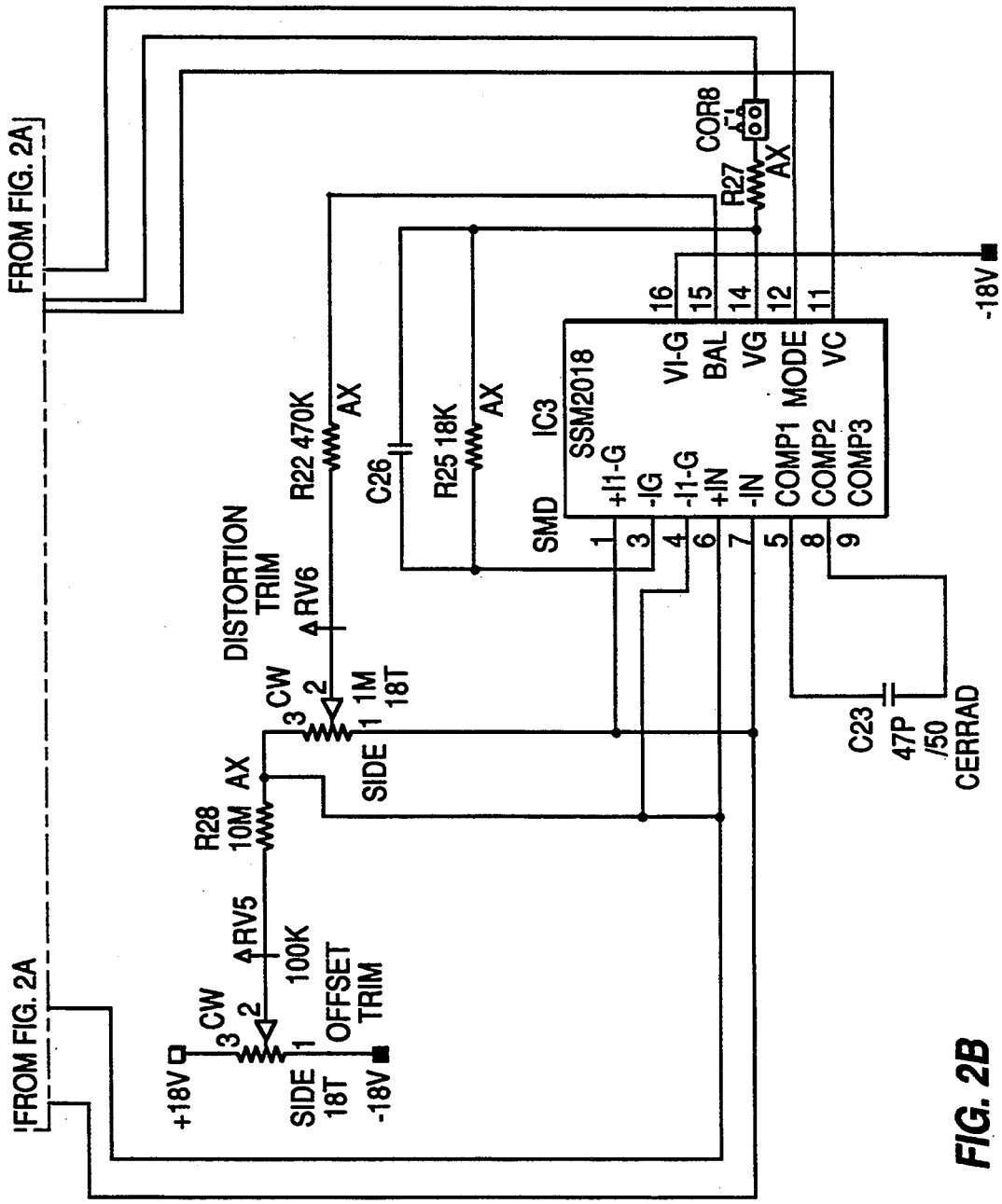

With reference to FIG. 2, an embodiment of the invention comprises a pair of VCAs IC1 and IC3. Although preferably, for example, the embodiment may be used in audio consoles, such as the Sony MXP-3000 series audio consoles, the embodiment may be used in other applications that use VCAs as well. The input audio signal is received at an input terminal T1 and passes through resistances R1 and R13 to +IN and −IN input pins of the VCA IC1 and through resistances R23 and R24 to +IN and −IN input pins of the VCA IC3. Preferably, for example, the resistances of R1 and R24, as well as the resistances of R13 and R23, are equal to each other so that equal currents are passed through resistances R1 and R24. As a result of the equal currents, the input audio signal is divided equally between VCAs IC1 and IC3.

The gain of VCA IC1 is controlled by a control voltage applied to its VG input pin. The second VCA IC3 has its gain controlled by the same control voltage applied to its VG input pin so that the gains of both VCAs IC1 and IC3 are commonly controlled. Since VCAs IC1 and IC3 are to cooperate and function as a single VCA, it is preferable to have their gains commonly controlled. However, in other applications, it may be desirable to have the gains of VCA IC1 and VCA IC3 separately controlled to the same or different values.

The output of VCA IC1 is connected to an inverting input of op-amp IC2 through a resistance R26 and the output of VCA IC3 is connected to the inverting input of op-amp IC2 through a resistance R27. The currents passing through resistances R26 and R27 are therefore summed together before being applied to the inverting input of op-amp IC2. A resistance R17 is connected between a non-inverting input of op-amp IC2 and ground. A parallel combination of a capacitor C14 and a resistance R4 is connected between the output of the op-amp IC2 and the inverting input of op-amp IC2.

By dividing the input signal equally among the two VCAs IC1 and IC3, an output signal is generated at output terminal T2 of the op-amp IC2 which has a reduced noise level and reduced distortion. For instance, the VCAs IC1 and IC3 were set to a gain of 6 dB and the op-amp IC2 was set to a gain of −6 dB in order to provide unity gain. While the coherent signals, such as hum and signal, sum at a ratio of 6 dB, random noises only sum at a ratio of 3 dB. Thus, a 3 dB increase in the signal to noise ratio ("S/N") is accomplished.

Figure 1:
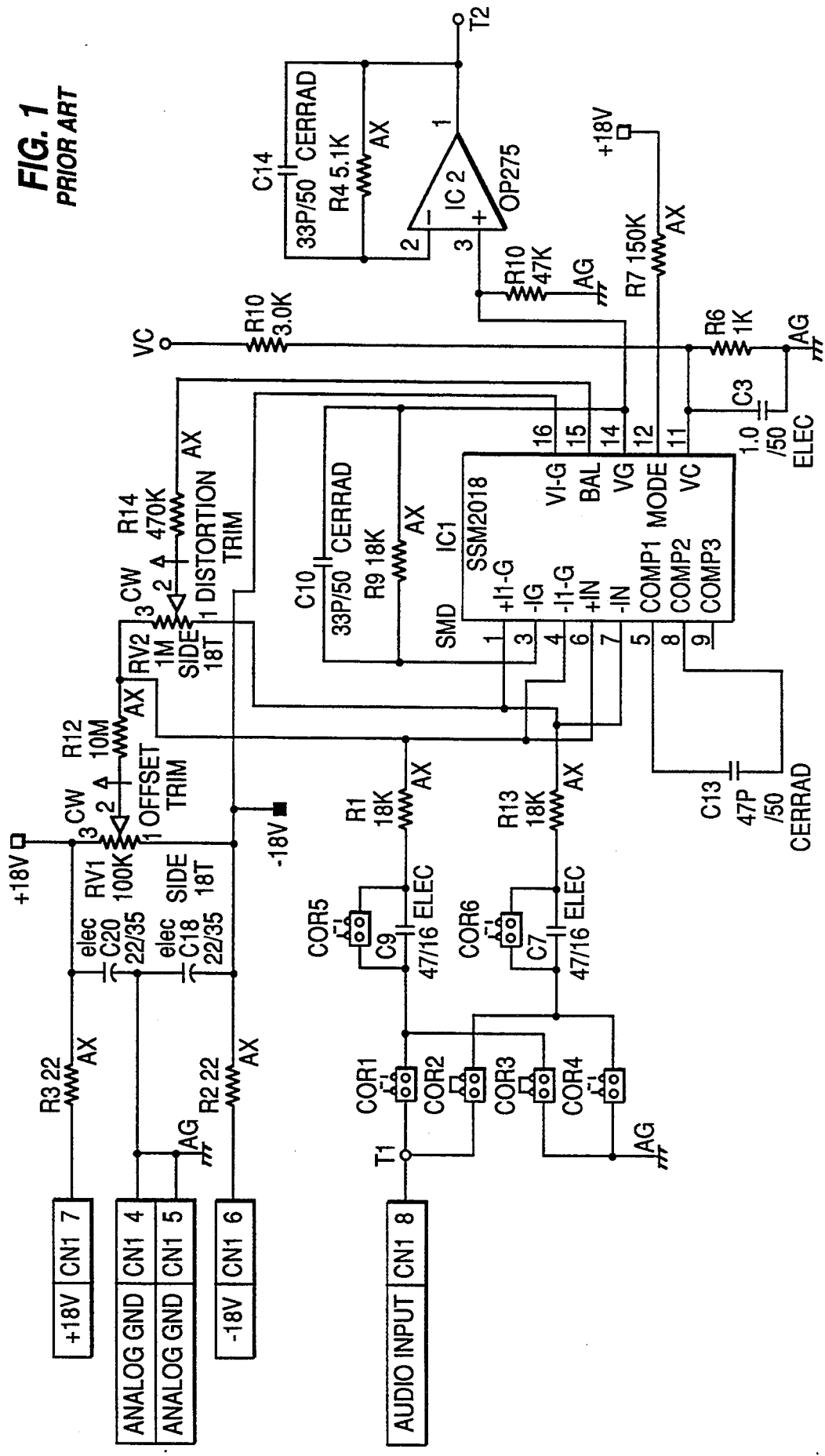
FIG. 1 is a schematic of a prior art apparatus using a VCA.

The embodiment of FIG. 2 has a noise level of −95.4 dB, which is about 3 dB less than the prior art embodiment of FIG. 1. Also, the THD is 0.0037% for 0 dB, 0.0124% for 20 dB, and 0.1088% for 21 dB. The IM distortion for the embodiment of FIG. 2 is 0.009% for 0 dB, 0.0159% for 12 dB, 0.0377% for 20 dB, and 0.054% for 21 dB. In comparison with the prior art of FIG. 1, the embodiment of FIG. 2 reduces the noise level from −92.5 dB to −95.4 dB, reduces the DC feed through by 6 dB, reduces the IM distortion from approximately 0.280% to 0.054% at 21 dB, and reduces the THD from 0.221% to 0.1088% at 21 dB.

The foregoing description of a preferred embodiment of the invention has been presented for purposes of illustration and description. It is not intended to be exhaustive or to limit the invention to the precise form disclosed. Many modifications and variations are possible in light of the above teaching.

For example, although the embodiment of the invention has been used with current sharing for VCAs, the current sharing may also be used with op-amps or transistors to reduce noise and distortion. Also, the input signal may be divided into more than two portions and may be applied to a respective larger number of VCAs. Additionally, although the VCAs receive equal portions of the input signal, unequal portions of the input signal may be applied to the VCAs.

The embodiment was chosen and described in order to best explain the principles of the invention and its practical application to thereby enable others skilled in the art to best utilize the invention and various embodiments and with various modifications as are suited to the particular use contemplated. It is intended that the scope of the invention only be limited by the claims appended hereto.

We claim:

1. An apparatus for reducing distortion, comprising:
   a first VCA, having a first gain, for receiving a first portion of an input signal and for generating an amplified first portion;
   a second VCA, having said first gain, for receiving a second portion of said input signal and for generating an amplified second portion; and
   summing means for adding said first amplified portion with said second amplified portion and for generating an output signal;
   wherein a signal to noise ratio in said output signal is increased and distortion in said output signal is decreased in comparison to said input signal.

2. The apparatus of claim 1, wherein said first and second VCAs have said first gain set by a common voltage.

3. The apparatus of claim 1, wherein said distortion comprises a total harmonic distortion and intermodulation distortion.

4. The apparatus of claim 1, wherein said first portion of said input signal equals said second portion of said input signal.

5. The apparatus of claim 1, wherein said summing means comprises an op-amp having a gain equal to an inverse of said first gain.

6. The apparatus of claim 1, wherein said first and second portions comprise first and second current portions of said input signal.

7. A method for reducing distortion in an input signal, comprising the steps of:
   dividing an input signal into two portions;
   amplifying, with a first VCA, a first portion of said input signal at a first gain to produce an amplified first portion;
   amplifying, with a second VCA, a second portion of said input signal at said firs gain to produce an amplified second portion; and
   summing said first and second amplified portions to produce an output signal;
   wherein a signal to noise ratio in said output signal is increased and distortion in said output signal is decreased in comparison to said input signal.

8. The method of claim 7, further comprising the step of setting said first gain of said first and second VCAs with a common control voltage.

9. The method of claim 7, wherein said step of summing produces said output signal which has a lowered total harmonic distortion and intermodulation distortion relative to said input signal.

10. The method of claim 7, wherein said step of dividing said input signal divides said input signal so that said first portion equals said second portion.

11. The method of claim 7, wherein said step of summing further comprises the step of amplifying a sum of said first and second portions at a second gain equal to an inverse of said first gain.

12. The method of claim 7, wherein said step of dividing comprises the step of dividing a current of said input signal into said two portions and said step of summing comprises the step of summing currents of said first and second amplified portions.

* * * * *